United States Patent
Watanabe (10) Patent No.: US 9,024,363 B2
(45) Date of Patent: May 5, 2015

(54) PHOTOELECTRIC CONVERSION APPARATUS AND IMAGING SYSTEM USING THE PHOTOELECTRIC CONVERSION APPARATUS

(71) Applicant: Canon Kabushiki Kaisha, Tokyo (JP)

(72) Inventor: Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/306,425

(22) Filed: Jun. 17, 2014

(65) Prior Publication Data

US 2014/0291732 A1    Oct. 2, 2014

Related U.S. Application Data

(60) Division of application No. 13/897,542, filed on May 20, 2013, now Pat. No. 8,841,713, which is a continuation of application No. 12/412,442, filed on Mar. 27, 2009, now Pat. No. 8,466,532.

(30) Foreign Application Priority Data

Apr. 9, 2008   (JP) ................................. 2008-101529

(51) Int. Cl.
*H01L 27/148*   (2006.01)
*H01L 29/768*   (2006.01)
*H01L 27/146*   (2006.01)

(52) U.S. Cl.
CPC .... *H01L 27/14806* (2013.01); *H01L 27/14603* (2013.01); *H01L 27/14609* (2013.01); *H01L 27/1463* (2013.01); *H01L 27/146* (2013.01); *H01L 29/76808* (2013.01)

(58) Field of Classification Search
CPC .............. H01L 27/146; H01L 27/1463; H01L 27/14603; H01L 27/14806; H01L 27/114609; H01L 29/76808; H01L 29/7869
USPC ................................... 257/225, 231, 428, 431
See application file for complete search history.

(56) References Cited

U.S. PATENT DOCUMENTS

| 5,637,893 | A  | 6/1997  | Furumiya    |
|-----------|----|---------|-------------|
| 6,566,678 | B1 | 5/2003  | Maeda et al.|
| 6,653,164 | B2 | 11/2003 | Miinda      |
| 6,731,337 | B2 | 5/2004  | Watanabe    |

(Continued)

FOREIGN PATENT DOCUMENTS

| JP | 2000-353801 | 12/2000 |
| JP | 2005-167588 | 6/2005  |

(Continued)

OTHER PUBLICATIONS

Sze, Physics of Semiconductor Devices, 2nd Ed. (John Wiley & Sons, 1981) 434-35.

*Primary Examiner* — Nikolay Yushin
(74) *Attorney, Agent, or Firm* — Fitzpatrick, Cella, Harper & Scinto (57) ABSTRACT

In a photoelectric conversion apparatus including a charge holding portion, a part of an element isolation region contacting with a semiconductor region constituting the charge holding portion extends from a reference surface including the light receiving surface of a photoelectric conversion element into a semiconductor substrate at a level equal to or deeper than the depth of the semiconductor region in comparison with the semiconductor region.

12 Claims, 9 Drawing Sheets

(56) References Cited

U.S. PATENT DOCUMENTS

| | | |
|---|---|---|
| 7,423,305 B2 | 9/2008 | Shinohara et al. |
| 7,456,880 B2 | 11/2008 | Okita et al. |
| 7,479,675 B2 | 1/2009 | Adachi |
| 7,514,732 B2 | 4/2009 | Okita et al. |
| 2003/0064539 A1 | 4/2003 | Miida |
| 2005/0040393 A1 | 2/2005 | Hong |
| 2006/0061674 A1 | 3/2006 | Iida et al. |
| 2007/0141801 A1 | 6/2007 | Kwon et al. |
| 2007/0272958 A1 | 11/2007 | Misaki et al. |
| 2008/0029787 A1 | 2/2008 | Watanabe et al. |
| 2008/0029793 A1 | 2/2008 | Watanabe et al. |
| 2008/0029796 A1 | 2/2008 | Mori et al. |
| 2008/0303930 A1 | 12/2008 | Kuroda et al. |
| 2009/0015699 A1 | 1/2009 | Watanabe et al. |
| 2009/0159945 A1 | 6/2009 | Okita et al. |

FOREIGN PATENT DOCUMENTS

| | | |
|---|---|---|
| JP | 2007-503722 | 2/2007 |
| JP | 2007-115948 | 5/2007 |
| JP | 2007-157912 | 6/2007 |
| JP | 2007-294531 | 11/2007 |
| JP | 2007-335682 | 12/2007 |
| JP | 2008-004692 | 1/2008 |
| JP | 2008-034772 | 2/2008 |

FIG. 9

PHOTOELECTRIC CONVERSION APPARATUS AND IMAGING SYSTEM USING THE PHOTOELECTRIC CONVERSION APPARATUS

RELATED APPLICATIONS

This application is division of application Ser. No. 13/897,542 filed May 20, 2013, which in turn is a continuation of application Ser. No. 12/412,442 filed on Mar. 27, 2009 (now U.S. Pat. No. 8,466,532), the entire disclosures of which are incorporated by reference herein. This application also claims foreign priority under 35 U.S.C. § 119 of Japanese Application No. 2008-101529 filed on Apr. 9, 2008.

BACKGROUND OF THE INVENTION

1. Field of the Invention

The present invention relates to the configuration of a photoelectric conversion apparatus including a charge holding portion.

2. Description of the Related Art

In recent years, a charge coupled device (CCD) type photoelectric conversion apparatus and a metal oxide semiconductor (MOS) type photoelectric conversion apparatus have been used in many digital still cameras and digital camcorders. In the MOS type photoelectric conversion apparatus, an element structure for realizing a global shutter function has been developed, which global shutter function makes constant the storage times of the photoelectric conversion elements. The element structure is the structure providing a charge holding portion in each of the photoelectric conversion elements. Japanese Patent Application Laid-Open No. 2007-294531 discloses a configuration including buried gate electrodes in the structure including the charge holding portions in order to suppress smears. Moreover, Japanese Patent Application Laid-Open No. 2008-004692 discloses the configuration of providing a semiconductor region of a conductivity type opposite to that of a charge holding portion under the charge holding portion in order to reduce the entering of a charge generated at a deep position in a semiconductor substrate into the charge holding portion (charge storing unit).

However, the technique disclosed in Japanese Patent Application Laid-Open No. 2007-294531 has the possibility of the mixture of a charge produced at a deep position in a semiconductor substrate and a charge from another element or the like into the charge holding portion. Moreover, also the technique disclosed in Japanese Patent Application Laid-Open No. 2008-004692 has the possibility of the mixture of a charge from another element or the like into the charge holding portion.

SUMMARY OF THE INVENTION

Accordingly, the present invention is directed to provide a photoelectric conversion apparatus including a charge holding portion for reducing the mixture of a charge.

An aspect of the present invention is a photoelectric conversion apparatus comprising: a semiconductor substrate; a first semiconductor region of a first conductivity type being arranged in the semiconductor substrate, and comprising a part of a photoelectric conversion element; a second semiconductor region of the first conductivity type being arranged in the semiconductor substrate, and holding an electric charge generated in the first semiconductor region; a gate electrode being arranged on the semiconductor substrate, and transferring the electric charge from the second semiconductor region; a third semiconductor region of the first conductivity type being arranged in the semiconductor substrate, wherein the electric charge is transferred by the gate electrode to the third semiconductor region; an element isolation region, for defining a first active region, being arranged in the semiconductor substrate and having an insulator; and a fourth semiconductor region being arranged along a side wall of the element isolation region in the semiconductor substrate, and operating as a dark current suppressing region for suppressing a dark current from the element isolation region, wherein the second semiconductor region is arranged in the first active region, and a part of the element isolation region contacts through the fourth semiconductor region to a part of the second semiconductor region, and extends from a reference surface including a light receiving surface of the photoelectric conversion element into the semiconductor substrate at a depth equal to or deeper than a depth of the second semiconductor region.

Moreover, another aspect of the present invention is a photoelectric conversion apparatus comprising: a semiconductor substrate; a first semiconductor region of a first conductivity type being arranged in the semiconductor substrate, and comprising a part of a photoelectric conversion element; a second semiconductor region of the first conductivity type being arranged in the semiconductor substrate, and holding an electric charge generated in the first semiconductor region; a gate electrode being arranged on the semiconductor substrate, and transferring the electric charge from the second semiconductor region; a third semiconductor region of the first conductivity type being arranged in the semiconductor substrate, wherein the electric charge is transferred by the gate electrode to the third semiconductor region; and an element isolation region, for defining a first active region, being arranged in the semiconductor substrate and having an insulator, wherein the second semiconductor region is arranged in the first active region, and a part of the element isolation region contacts to a part of the second semiconductor region, and extends from a reference surface including a light receiving surface of the photoelectric conversion element into the semiconductor substrate at a depth equal to or deeper than a depth of the second semiconductor region.

According to the present invention, the leakage of a charge into a charge holding portion can be reduced, and a low noise photoelectric conversion apparatus can be provided.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE EMBODIMENTS

The present invention relates to a photoelectric conversion apparatus including a charge holding portion in an imaging region and an element isolation region contacting with a semiconductor region operating as a charge holding portion directly or through a semiconductor region operating as a channel stop. The element isolation region is configured to include an insulator, and is formed to a depth equal to that of the semiconductor region of the charge holding portion or deeper than the semiconductor region from a reference surface including a light receiving surface of a photoelectric conversion element. By the configuration, the mixture of a charge into the charge holding portion can be reduced.

Next, the circuit of the photoelectric conversion apparatus including the charge holding portions will be described. Embodiments will be described on the supposition that a signal charge (referred also as an electric charge or carrier) is an electron, and that a MOS transistor is an N type one.

(Example of Pixel Circuits)

Figure 1:
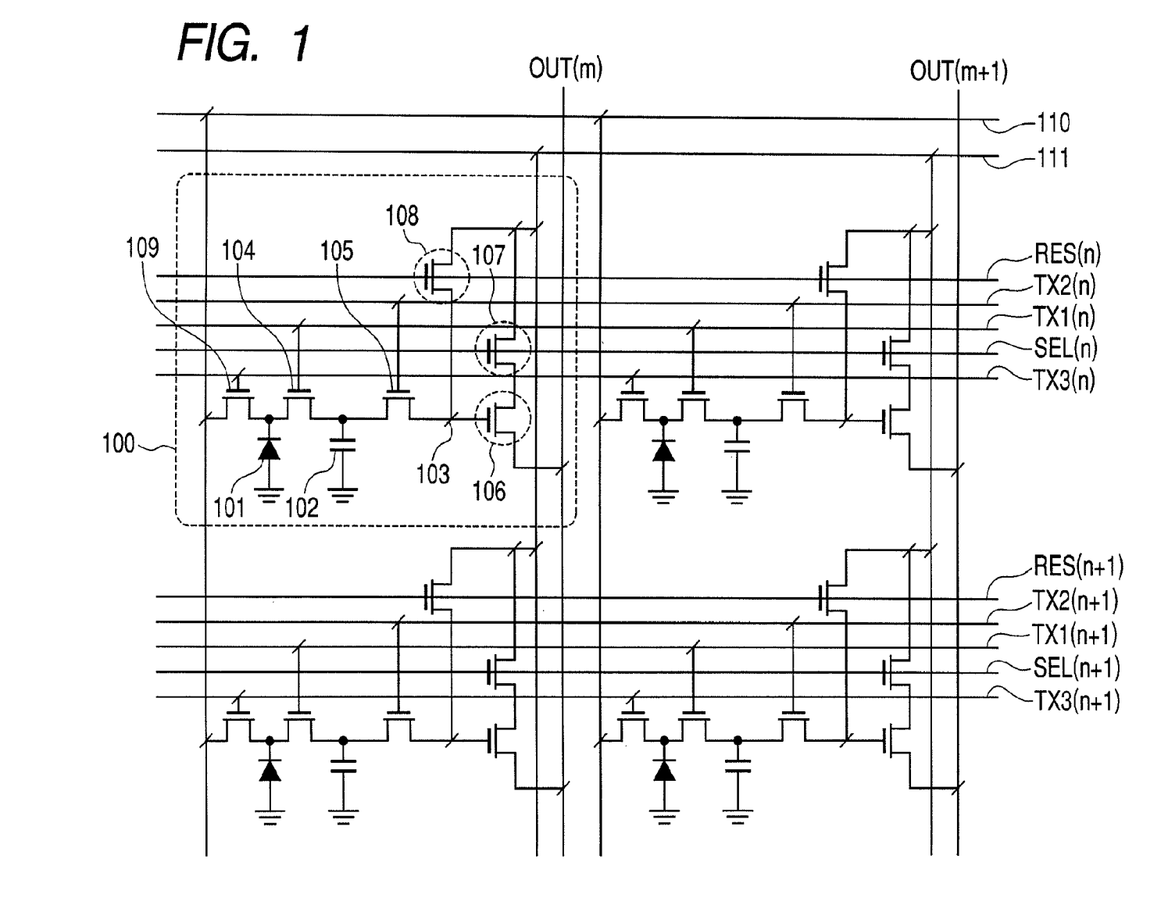
FIG. 1 illustrates an example of pixel circuits of a photoelectric conversion apparatus.

FIG. 1 illustrates an example of pixel circuits to which the present invention is applicable. A pixel is the minimum repetition unit including one photoelectric conversion element, and the pixel is denoted by a numeral 100 in FIG. 1. In a photoelectric conversion apparatus, the pixels 100 are arranged in one dimension or two dimensions to constitute an imaging region. In FIG. 1, four pixels 100 are arranged in two columns (m, m+1) and two rows (n, n+1).

The pixel 100 is now described. The pixel 100 includes a photoelectric conversion element 101, a charge holding portion 102, a floating diffusion portion 103, a first gate electrode 104, which transfers a charge generated in the photoelectric conversion element 101 to the charge holding portion 102, a second gate electrode 105, which transfers the charge in the charge holding portion 102 to the floating diffusion portion 103, and an amplifying MOS transistor 106, including a gate electrode connected to the floating diffusion portion 103 to constitute the same node. The amplifying MOS transistor 106 outputs a signal according to the electric potential at the floating diffusion portion 103 to a signal line OUT. The pixel 100 further includes a selection MOS transistor 107, controlling the voltage supplied to the drain of the amplifying MOS transistor 106 and the output of a signal, a reset MOS transistor 108, resetting the node of the gate electrode of the amplifying MOS transistor 106 to a prescribed electric potential (reset electric potential), and a third gate electrode 109, controlling the discharge of a charge. The third gate electrode 109 enables the discharge of the charge of the photoelectric conversion element 101 to a node of a power source line 110. A portion including the third gate electrode 109 performing such a discharge operation and the node of the power source line 110 is referred to as a discharge portion. The pixel 100 further includes a power source line 111 connected to the reset MOS transistor 108 and the like, which power source line 111 may be the same wiring as that of the power source line 110, and control lines RES, TX2, TX1, SEL, and TX3, connected to the gate electrode of each of the MOS transistors for supplying control pulses to the gate electrodes. The control line RES is connected to the gate electrode of the reset MOS transistor 108; the control line TX1 is connected to the first gate electrode 104; the control line TX2 is connected to the second gate electrode 105; the control line TX3 is connected to the third gate electrode 109; and the control line SEL is connected to the gate electrode of the selection MOS transistor 107.

In this circuit, the following operation can be preformed. First, the charges generated in a plurality of photoelectric conversion elements 101 are transferred from the plurality of photoelectric conversion elements 101 to the respective charge holding portions 102 at the same timing. Then, new charges generated in the photoelectric conversion elements 101 are obtained while the charge holding portions 102 are holding the transferred charges.

Moreover, by this circuit, the following operation can be also performed. The charges generated in the photoelectric conversion elements 101 are simultaneously accumulated in the photoelectric conversion element 101 and the charge holding portions 102. Then, without performing any reset operations, the charges are transferred from the plurality of charge holding portions 102 to the floating diffusion portions 103 at the same timing. That is, this circuit enables the operation of not determining one accumulation period on the basis of the first gate electrode 104 but regulating the accumulation period on the basis of, for example, the third gate electrode 109. The one accumulation period is determined in common in the respective photoelectric conversion portions at the time of photographing an image of one frame, and the one accumulation period can be also expressed as the exposure time of each frame here. As the configuration and operation for performing the operation, the followings can be given concretely. A first configuration is the one by which the first gate electrode 104 between the photoelectric conversion element 101 and the charge holding portion 102 can perform the operation thereof as a switch, and the configuration is that of performing the operation of turning on the switch at the time of the accumulation of charges in the photoelectric conversion element 101 and the charge holding portion 102. Next, the second configuration is the one in which the channel between the photoelectric conversion element 101 and the charge holding portion 102 is made as the so-called buried channel, and in which the photoelectric conversion element 101 and the charge holding portion 102 conduct charges. The buried channel means a buried channel type transistor here. The configuration is, for example, that of forming a semiconductor region in which electric potential is lower than those in the source region and the drain region to a signal charge, which region is situated at a position shallower than the depths of the source region and the drain region under the gate electrode 104 between the source region and the drain region.

In both the configurations, the charge holding portion 102 has a period for holding a charge during a period until the charge is read out or during a period in which the charge is being accumulated. In particular, if the latter accumulation of the charge is performed in the photoelectric conversion element 101 and the charge holding portion 102, then the charge holding portion 102 holds the charge for a longer time in comparison with that of the former period until the charge is read out. Accordingly, it is desirable to apply the configuration of the charge holding portion 102 of the present embodiment.

The pixel circuit of the present invention is not limited to the one illustrated in FIG. 1, but the configuration in which a plurality of photoelectric conversion elements shares a charge holding portion and a read-out circuit may be adopted.

In the following, the embodiments of the present invention will be described with reference to the attached drawings.

(First Embodiment)

Figure 2:
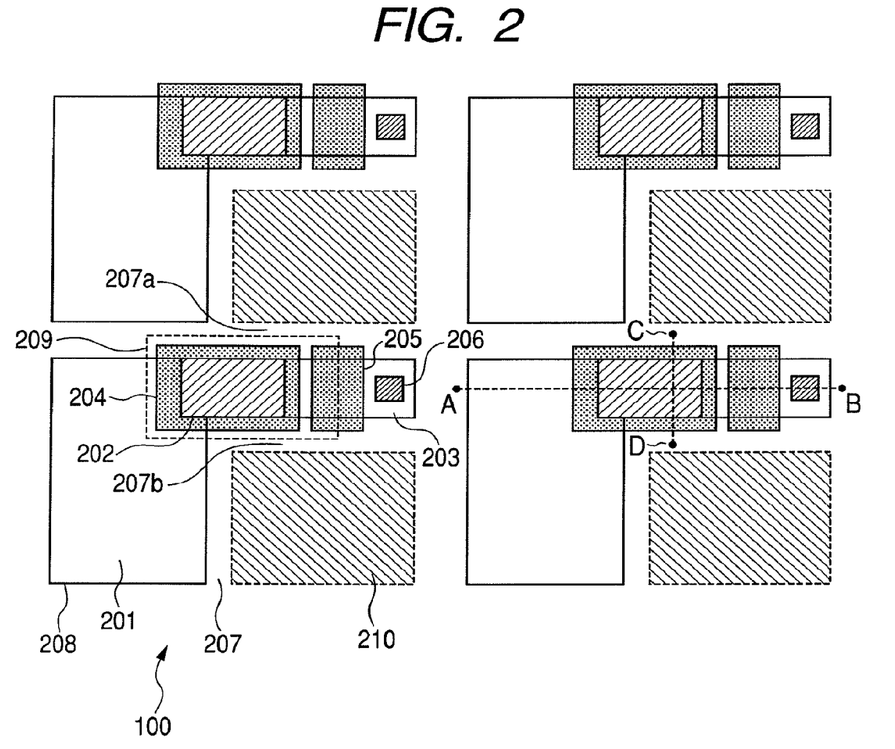
FIG. 2 is a planar layout chart of the photoelectric conversion apparatus for illustrating a first embodiment.

The configuration of the present embodiment is described with reference to FIGS. 2, 3A, and 3B. FIG. 2 is a planar layout chart of the four pixels 100 illustrated in FIG. 1. Each of the pixels 100 includes a semiconductor region 201, in which one of the photoelectric conversion elements 101 is formed, the surface of which semiconductor region 201 is a light receiving surface, a second semiconductor region 202, in which one of the charge holding portions 102 is formed, a third semiconductor region 203, in which one of the floating diffusion portions 103 is formed, a first gate electrode 204, which extends over the second semiconductor region 202, a second gate electrode 205, a contact 206 for electrically connecting the third semiconductor region 203 to one of the amplifying MOS transistors 106, and an element isolation region 207, which isolates elements electrically from one another and defines an active region. The element isolation region 207 is configured to include a shallow trench insulation (STI) insulator or the like. The pixel 100 further includes a first active region 208 defined by the element isolation region 207, in which region 208 the semiconductor region 201 comprising the photoelectric conversion element 101 and the semiconductor region 202 comprising the charge holding portion 102 are arranged, and a light shield 209 performing the light shielding of the charge holding portion 102. The other elements of the pixel 100, such as the amplifying MOS transistor 106, are set to be arranged in a region 210, and the description of the arrangement is omitted.

Figure 3A:
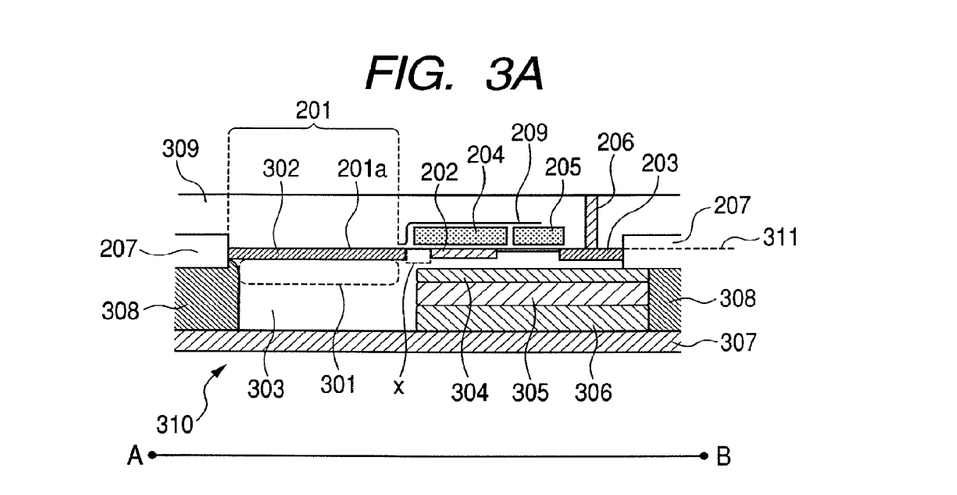
FIG. 3A is a typical sectional view taken along the line A-B of FIG. 2.
Figure 3B:
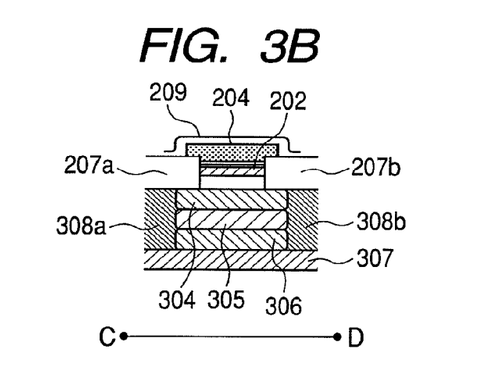
FIG. 3B is a typical sectional view taken along the line C-D of FIG. 2.
Figure 3C:
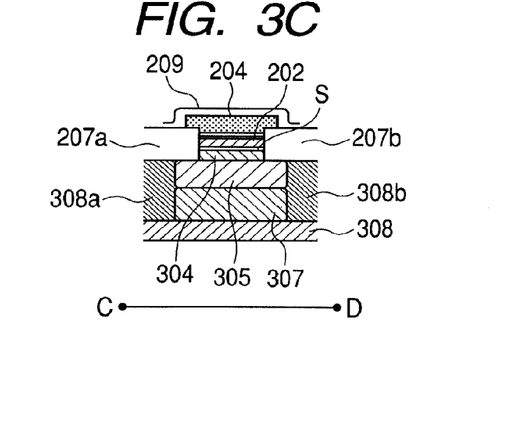
FIG. 3C is a typical sectional view illustrating a modification.
Figure 3D:
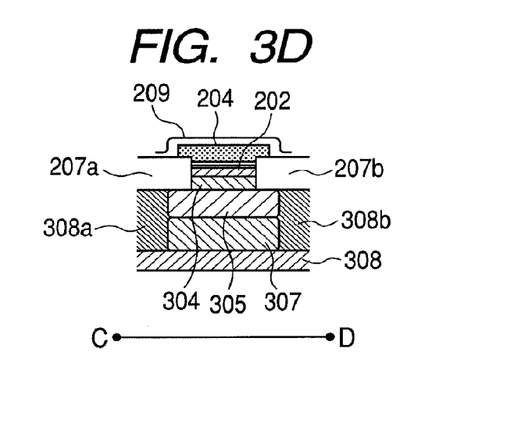
FIG. 3D is a typical sectional view illustrating the other modification.

FIGS. 3A and 3B illustrate typical sectional views of the photoelectric conversion apparatus. FIG. 3A is the typical sectional view taken along the line A-B of FIG. 2, and FIG. 3B is the typical sectional view taken along the line C-D of FIG. 2. FIGS. 3C and 3D are drawings similar to FIG. 3B and illustrate modifications.

FIG. 3A is described. The parts having the similar functions to those of FIG. 2 are denoted by the same marks as those of FIG. 2, and their descriptions are omitted. The pixel 100 includes a first conductivity type (hereinafter referred to as n type) first semiconductor region 301, a second conductivity type (hereinafter referred to as p type) semiconductor region 302 for forming a buried type photoelectric conversion element arranged on the surface of the first semiconductor region 301, and an n type semiconductor region 303, the impurity concentration of which is lower than that of the first semiconductor region 301. The photoelectric conversion element 201 of the present embodiment includes the semiconductor regions 301-303. Moreover, the photoelectric conversion element 201 includes a light receiving surface 201a. Furthermore, the pixel 100 includes a p type fifth semiconductor region 304 arranged under the second semiconductor region 202, p type semiconductor regions 305-308, an insulation film 309, and a semiconductor region 310, which is a basis material part having the original properties of a semiconductor substrate and has an n type conductivity type. The p type semiconductor region 307 also has the function of electrically isolating the n type semiconductor region 310 from the photoelectric conversion element 201 and the like. And, the p type semiconductor region 307 forms PN junction with the n type semiconductor region 303 and operates as a part of a photoelectric conversion element. The p type semiconductor region 308 is arranged under the element isolation region 207 and electrically isolates between the pixel 100 and an adjacent pixel 100 and between the photoelectric conversion element 201 and the other elements. And, the p type semiconductor region 308 forms PN junction with the n type semiconductor region 303 and operates as a part of a photoelectric conversion element.

The semiconductor substrate means the one that is a material substrate and includes a member in the state of forming one or a plurality of semiconductor regions therein, a member on the way of a series of manufacturing steps, and a member subjected to a series of manufacturing steps here. The surface of the photoelectric conversion element 201, i.e. the interface between the semiconductor region in which the photoelectric conversion element 201 is formed and the insulation film 309, such as an oxide film, is made to be the light receiving surface 201a. A surface including the light receiving surface 201a is set as a reference surface 311. The direction from the reference surface 311 to the semiconductor region 310 is set as a down direction and further as the depth direction of the semiconductor substrate. It can be said that the part below the reference surface 311 is the semiconductor substrate here. The upper part of the element isolation region 207 sometimes exceeds the reference surface 311 here. However, the lower part of the element isolation region 207 is arranged on the side of the semiconductor substrate in relation to the reference surface 311, and consequently it can be said that the element isolation region 207 is arranged on the semiconductor substrate.

Next, FIG. 3B is described. The parts having similar functions as those of FIG. 3A are denoted by the same marks as those in FIG. 1, and their descriptions are omitted. The insulation film 309 is omitted. The second semiconductor region 202 contacts with a part of the element isolation region 207 defining the first active region, in which the second semiconductor region 202 is arranged, here. Then, the part of the element isolation region 207 contacting with the second semiconductor region 202 is arranged to be farther than the second semiconductor region 202 from the reference surface 311, that is, is arranged deeper than the semiconductor region 202 toward the semiconductor region 310. The configuration including the element isolation region 207 to a position deeper into the semiconductor substrate than that of the second semiconductor region 202 enables the reduction of the mixture of a charge from a lateral direction (the direction in which the element isolation region 207 exists). Moreover, if the configuration of the charge holding portion 102 of the present embodiment is applied in the following case, then the application is especially effective. The case is the one in which the first gate electrode 104, the first semiconductor region 301, and the second semiconductor region 302 have the configuration like a buried channel type transistor. To put it more concretely, an n type semiconductor region having a lower impurity concentration than that of the first semiconductor region 301 is formed at a position shallower than at least one of the first semiconductor region 301 and the second semiconductor region 202 under the first gate electrode 104 between the first semiconductor region 301 and the second semiconductor region 202. The n type semiconductor region is referred to as a sixth semiconductor region x. In such a configuration, since the time of holding a charge in the charge holding portion 102 is long, the configuration is especially effective. Incidentally, even in the case of the configuration in which the element isolation region 207 is formed until the depth equal to that of the second semiconductor region 202, the reduction of the mixture of the charge in the lateral direction can be performed here.

Furthermore, the fifth semiconductor region 304 contacts with the bottom of the element isolation region 207 to be arranged under the second semiconductor region 202. That is, the second semiconductor region 202 is enclosed in this cross section. By this configuration, the mixture of a charge from the lateral direction and from a deep part of the semiconductor substrate can be reduced.

Moreover, the light shield 209 is provided over the second semiconductor region 202. By this configuration, the incidence of lights into the charge holding portion 102 can be suppressed. Furthermore, since the light shield 209 extends to the element isolation region 207, the incidence of lights into the charge holding portion 102 can be more reduced.

An interval is formed between the second semiconductor region 202 and the fifth semiconductor region 304 here. The interval is, for example, an n type semiconductor region of a lower impurity concentration than that of the second semiconductor region 202 or a p type semiconductor region of a lower impurity concentration than that of the fifth semiconductor region 304. Moreover, as illustrated in FIG. 3C, the fifth semiconductor region 304 may be arranged above the bottom of the element isolation region 207. The second semiconductor region 202 is offset from the fifth semiconductor region 304 to form a space S. Furthermore, as illustrated in FIG. 3D, the fifth semiconductor region 304 may be arranged to form a PN junction interface together with the second semiconductor region 202. By this configuration, the capacitance of the PN junction increases, and consequently the capacitance value of the charge holding portion 102 can be increased. Therein, in FIG. 3D, a PN junction interface between the second semiconductor region 202 and the fifth semiconductor region 304 is positioned closely to a reference surface rather than a bottom of the element isolation region 207. However, when the second semiconductor region 202 and the element isolation region 207 are at the same depth, the PN junction interface between the second semiconductor region 202 and the fifth semiconductor region 304 is at the same depth as that of the element isolation region 207. If the conductivity type of each of the semiconductor regions 201-203, 301-308, and 310 is the same one as that of the neighboring semiconductor region, then a region having an impurity concentration that almost same with the that of the neighboring semiconductor region is defined as the outer edge of each of the semiconductor regions 201-203, 301-308, and 310 here. Furthermore, if the conductivity type of the neighboring semiconductor region is the opposite one to that of each of the semiconductor regions 201-203, 301-308, and 310, then the region in which the respective net impurity concentrations become almost zero is defined as the outer edge to be the PN junction interface. Incidentally, the net impurity concentration means the difference of the concentrations between N type impurities and P type impurities. The depths of the semiconductor regions are described with reference to the depth of the PN junction interface.

Moreover, it is desirable to configure the semiconductor regions 304-307 so that the electric potential to a charge may lower in the p type semiconductor regions 304-307 under the second semiconductor region 202 toward the deep part of the semiconductor substrate in order that the p type impurity concentrations of the semiconductor regions 304-307 may lower. The reason why the configuration is desirable is that such a configuration enables the rapid discharge of a charge that is not desired to be taken into the second semiconductor region 202 to the semiconductor region 310. Incidentally, even if there is a part in which electric potential rises in the semiconductor regions 304-307, it is only necessary to be able to discharge the charge to the semiconductor region 310.

(Second Embodiment)

Figure 4A:
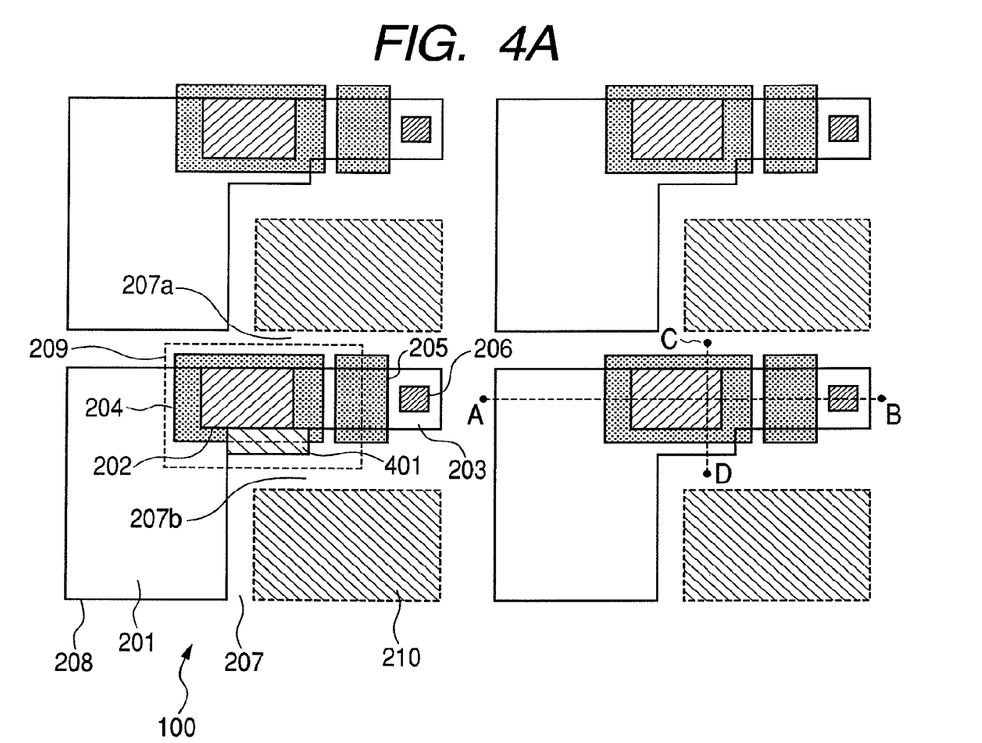
FIG. 4A is a planar layout chart of a photoelectric conversion apparatus for illustrating a second embodiment.
Figure 4B:
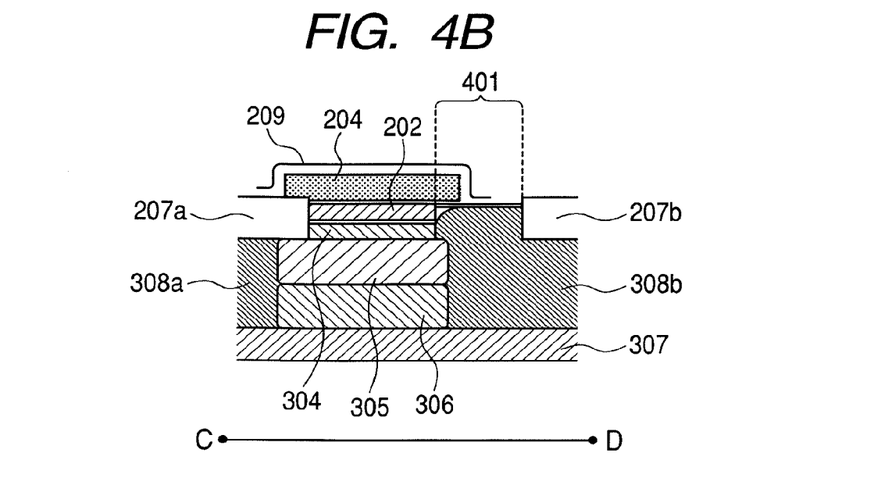
FIG. 4B is a typical sectional view taken along the line C-D of FIG. 4A.

The present embodiment is different from the first embodiment in the arrangement of the element isolation region 207, and more particularly is different in the arrangement relationship between the second semiconductor region 202 and the element isolation region 207. The present embodiment is described with reference to FIGS. 4A and 4B. FIG. 4A is a planar layout chart, and FIG. 4B is a typical sectional view. FIG. 4A corresponds to FIG. 2, and FIG. 4B corresponds to FIG. 3D. In FIGS. 4A and 4B, the similar configurations to those of the first embodiment are denoted by the same marks as those of the first embodiment, and their descriptions are omitted.

In FIGS. 4A and 4B, parts close to the second semiconductor region 202 of the element isolation region 207 are denoted by 207a and 207b for the sake of description. Since the shape and arrangement of the element isolation region 207, which defines the first active region 208, are different from those of the first embodiment, the second semiconductor region 202 does not contact with the element isolation region 207b. There is a region 401 between the second semiconductor region 202 and the element isolation region 207b. Also by this configuration, the element isolation region 207a contacts with at least a part of the second semiconductor region 202, and consequently the mixture of a charge from the lateral direction can be reduced.

Moreover, the p type semiconductor region 308 is formed to extend to the region 401. The p type semiconductor region 308 may not be formed in the region 401 between the second semiconductor region 202 and the element isolation region 207b. However, by forming the semiconductor region 308 in the region 401, the mixture of a charge can be more reduced.

The configuration of the first embodiment illustrated in FIG. 3B or 3C can be applied to the present embodiment.

(Third Embodiment)

Figure 5:
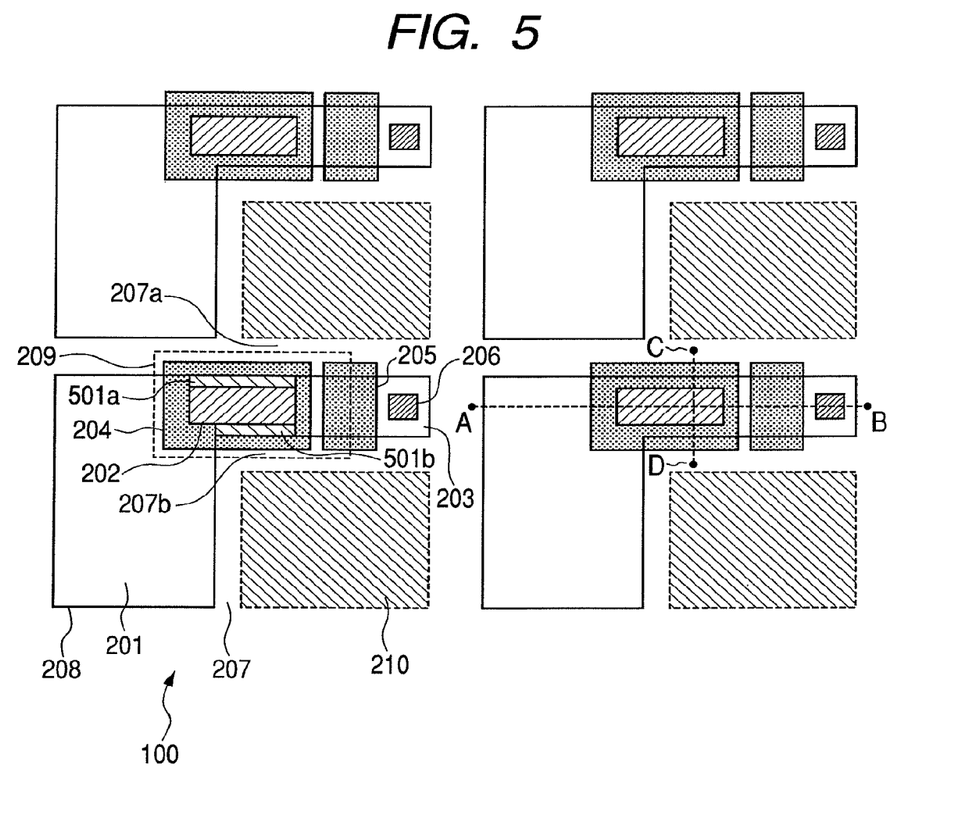
FIG. 5 is a planar layout chart of a photoelectric conversion apparatus for illustrating a third embodiment.
Figure 6A:
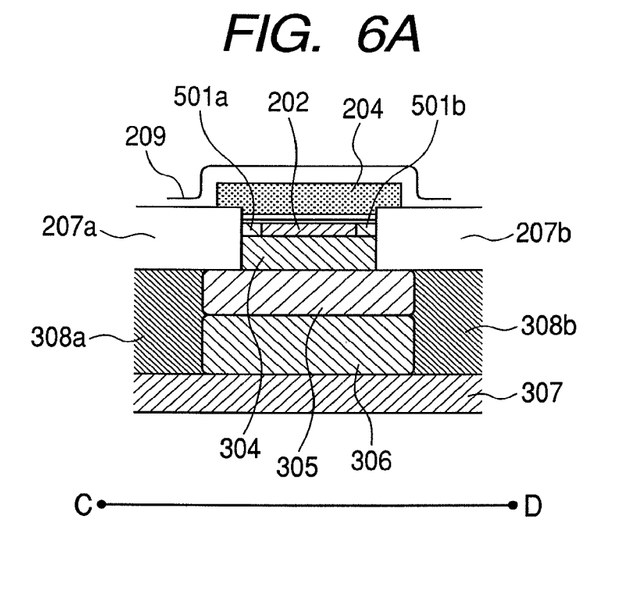
FIG. 6A is a typical sectional view taken along the line C-D of FIG. 5.
Figure 6B:
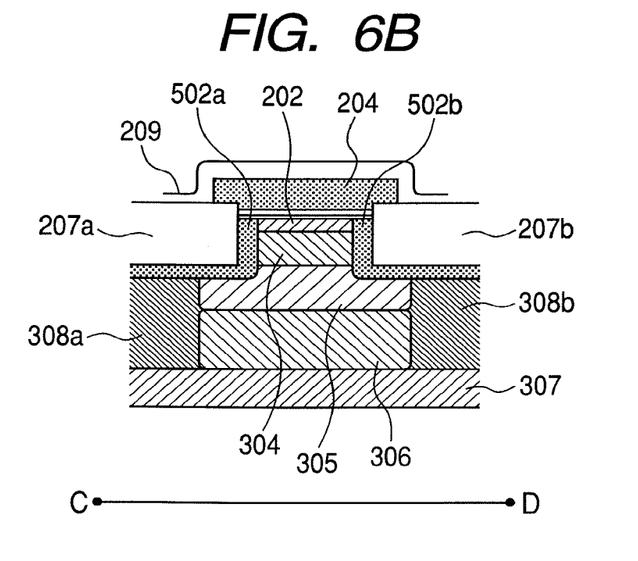
FIG. 6B is a typical sectional view illustrating a modification.

The present embodiment differs from the first embodiment in the arrangements of the second semiconductor region 202 and the element isolation region 207. The present embodiment is described with reference to FIGS. 5, 6A, and 6B. FIG. 5 is a planar layout chart, and FIGS. 6A and 6B are typical sectional views. FIG. 5 corresponds to FIG. 2, and FIG. 6A corresponds to FIG. 3D. FIG. 6B is a view for illustrating a modification of the present embodiment, and corresponds to FIG. 6A. The similar configurations to those of the first embodiment are denoted by the same marks as those of the first embodiment, and their descriptions are omitted.

As illustrated in FIG. 5, the second semiconductor region 202 extends not to an end of the first active region 208, and there is a region 501 between the element isolation region 207 and the second semiconductor region 202. In FIG. 6A corresponding to FIG. 5, there are regions 501a and 501b between the second semiconductor region 202 and the element isolation regions 207a and 207b, respectively, and the second semiconductor region 202 is arranged by being offset from the element isolation region 207 by the width of the region 501. By this configuration, the dark current generated by a defect of the interface between the element isolation region 207 and the semiconductor region 202 can be reduced. That is, it can be also said that the region 501 is a dark current suppressing region. The region 501 is a p type semiconductor region. And, the region 501 may be a thin N type semiconductor region. A dark current can be reduced rather that in case that the second semiconductor region 202 contacts the element isolation region 207.

FIG. 6B illustrates a modification of FIG. 6A. A p type fourth semiconductor region 502 may be arranged in the region 501. The fourth semiconductor region 502 is arranged on the side wall and bottom of the element isolation region 207, and is desirably arranged to enclose the circumference of the element isolation region 207. The fourth semiconductor region 502 is a p type semiconductor region of a higher impurity concentration than that of the fifth semiconductor region 304, and can operate as a dark current suppressing region to reduce the dark current from the element isolation region 207. The fourth semiconductor region 502 may operate as a channel stop. By including this fourth semiconductor region 502, the noise from the element isolation region 207 can be more reduced in comparison with the configuration of FIG. 6A. Moreover, by the fact that the second semiconductor region 202 and the high impurity concentration p type fourth semiconductor region 502 have a PN junction interface between them, the capacitance of the second semiconductor region 202 can be increased.

In the present embodiment, the example in which the fourth semiconductor region 502 is arranged in the offset region 501 has been described. However, the fourth semiconductor region 502 is a high impurity concentration p type semiconductor region, and may be arranged so as to cancel the second semiconductor region 202 contacting with the element isolation region 207 as in the first embodiment.

Moreover, the configuration of the charge holding portion 102 of the present embodiment may be applied to the following case. The case is that of including the sixth semiconductor region as described in the first embodiment to form the configuration like a buried channel type transistor including the first gate electrode 104, the first semiconductor region 301, and the second semiconductor region 202. To put it more concretely, an n type semiconductor region of a lower impurity concentration than that of the first semiconductor region 301 is formed at a position shallower than those of the first semiconductor region 301 and the second semiconductor region under the first gate electrode 104 between the first semiconductor region 301 and the second semiconductor region 202. Since a time period during which a charge is held in the charge holding portion 102 is long, this configuration is especially effective.

The arrangement of the fifth semiconductor region 304 of the first embodiment illustrated in FIG. 3B or 3C can be also applied to the present embodiment. Moreover, the configuration in which a part of the element isolation region 207 is separated from the second semiconductor region 202 like in the second embodiment may be adopted.

(Fourth Embodiment)

Figure 7A:
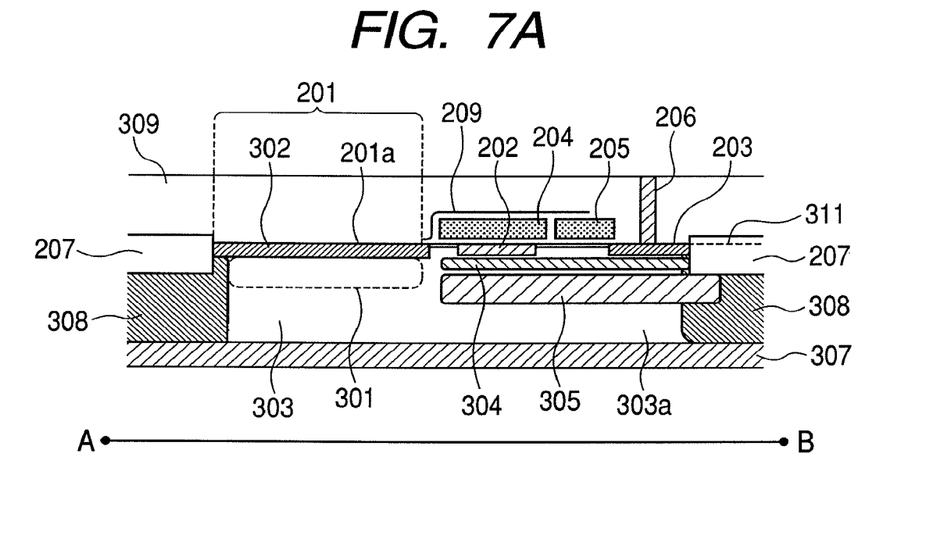
FIG. 7A is a typical sectional view taken along the line A-B of FIG. 2 for illustrating a fourth embodiment.
Figure 7B:
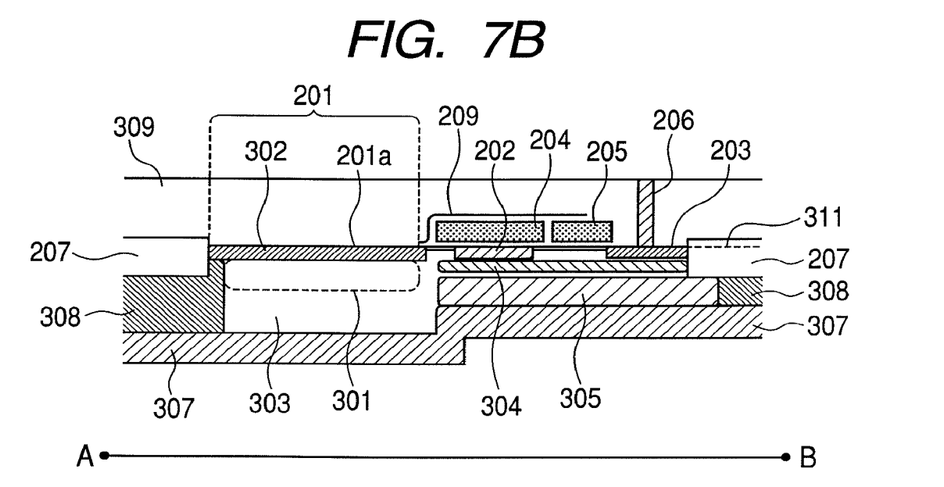
FIG. 7B is a typical sectional view illustrating a modification.

The present embodiment is described with reference to FIGS. 7A and 7B. The present embodiment differs from the first embodiment in that the present embodiment does not include the p type semiconductor region 306 but includes a region 303a. FIG. 7A is a typical sectional view corresponding to FIG. 3A. Moreover, FIG. 7B is a typical sectional view illustrating a modification of the present embodiment corresponding to FIG. 7A. The similar configurations to those of the first embodiment are denoted by the same marks as those of the first embodiment, and their descriptions are omitted.

First, the configuration of FIG. 7A is described. In the present embodiment, the p type semiconductor region 306, which exists in FIG. 3A, does not exist under the second semiconductor region 202, which becomes the charge holding portion 102, but the region 303a continuing from the semiconductor region 303 exists therein. The semiconductor region 303 may extend into the region 303a, and it is only necessary for the region 303a to be electrically connected to the semiconductor region 303. By this configuration, if an obliquely entering light generates a charge owing to photoelectric conversion under the second semiconductor region 202, then it becomes easy to collect the charge into the first semiconductor region 301 through the semiconductor region 303. Then, the improvement of the sensitivity of the photoelectric conversion apparatus can be expected. Furthermore, since it becomes difficult for a charge to move from the region 303a to the second semiconductor region 202 owing to the existence of the p type semiconductor regions 304 and 305, the mixture of the charge into the second semiconductor region 202 can be reduced.

In FIG. 7B, the p type semiconductor region 306, which exists in FIG. 3A, does not exist, but the p type semiconductor region 307 exists in proximity to the p type semiconductor region 305. By this configuration, the charge generated under the second semiconductor region 202 can be discharged to the semiconductor region 310, and then the mixture of the charge into the second semiconductor region 202 can be reduced.

Moreover, it is desirable to configure the p type semiconductor regions 304, 305, and 307 under the second semiconductor region 202 so that the electric potential to a charge may lower in the p type semiconductor regions 304, 305, and 307 toward the deep part of the semiconductor substrate in order that the p type impurity concentrations of the semiconductor regions 304, 305, and 307 may lower. The reason why the configuration is desirable is that such a configuration enables the discharge of a charge that is not desired to be taken into the second semiconductor region 202 to the semiconductor region 310 at a high probability. Incidentally, even if there is a part in which electric potential rises in the semiconductor regions 304, 305, and 307, it is only necessary to be able to discharge the charge to the semiconductor region 310.

It is also possible to apply the configurations of the first to third embodiments to the present embodiment by suitably combining the configurations of the first to third embodiments.

(Fifth Embodiment)

Figure 8A:
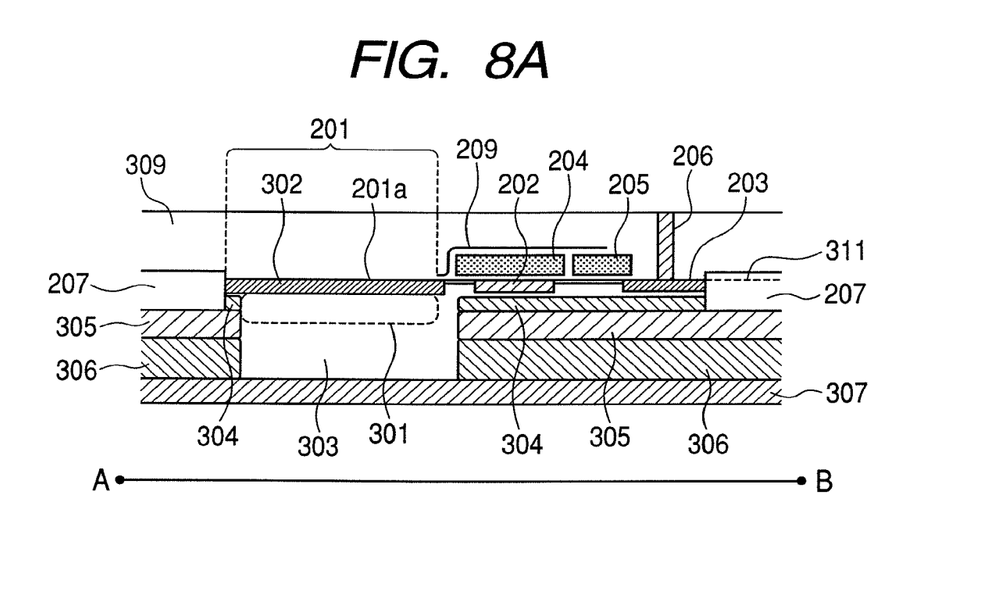
FIG. 8A is a typical sectional view taken along the line A-B of FIG. 2 for illustrating a fifth embodiment.
Figure 8B:
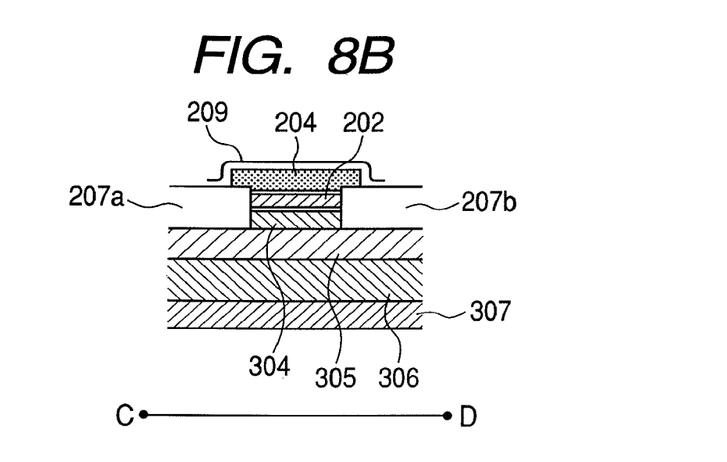
FIG. 8B is a typical sectional view taken along the line C-D of FIG. 2.

The present embodiment is described with reference to FIGS. 8A and 8B. The present embodiment differs from the first embodiment in that the p type semiconductor region 308 does not exists, and that the p type semiconductor regions 304-306 extend to the under part of the element isolation region 207. FIG. 8A is a typical sectional view corresponding to FIG. 3A, and FIG. 8B is a typical sectional view corresponding to FIG. 3D. The configurations similar to those of the first embodiment are denoted by the same marks as those of the first embodiment, and their descriptions are omitted.

As illustrated in FIGS. 8A and 8B, in the present embodiment, the p type semiconductor regions 304, 305, and 306 are arranged to extend to the under part of the element isolation region 207. In other words, the p type semiconductor regions 304, 305, and 306 are arranged on the whole surface of the semiconductor substrate except the part of the photoelectric conversion element 201. By this configuration, the steps at the time of manufacturing can be reduced. Moreover, the possibility of the occurrence of a change of the property of the photoelectric conversion element 201 owing to the dispersion of positions at the time of manufacturing can be reduced.

It is desirable similarly to the other embodiments here to configure the p type semiconductor regions 304-307 under the second semiconductor region 202 so that the electric potential to a charge may lower in the p type semiconductor regions 304-307 toward the deep part of the semiconductor substrate in order that the p type impurity concentrations of the semiconductor regions 304-307 may lower. The reason why the configuration is desirable is that such a configuration enables the discharge of a charge that is not desired to be taken into the second semiconductor region 202 to the semiconductor region 310 at a high probability. Incidentally, even if there is a part in which electric potential rises in the semiconductor regions 304-307, it is only necessary to be able to discharge the charge to the semiconductor region 310.

Moreover, it is also possible to apply the configurations of the first to fourth embodiments to the present embodiment by suitably combining the configurations. For example, as shown in FIG. 7A, the semiconductor region 303a may be arranged under the second semiconductor region 202.

(Application to Imaging System)

In the present embodiment, the case of applying the photoelectric conversion apparatus that have been described with regard to the first to fifth embodiments to an imaging system is described with reference to FIG. 9. The imaging system means a digital still camera, a digital video camera, and a digital camera for a portable telephone.

Figure 9:
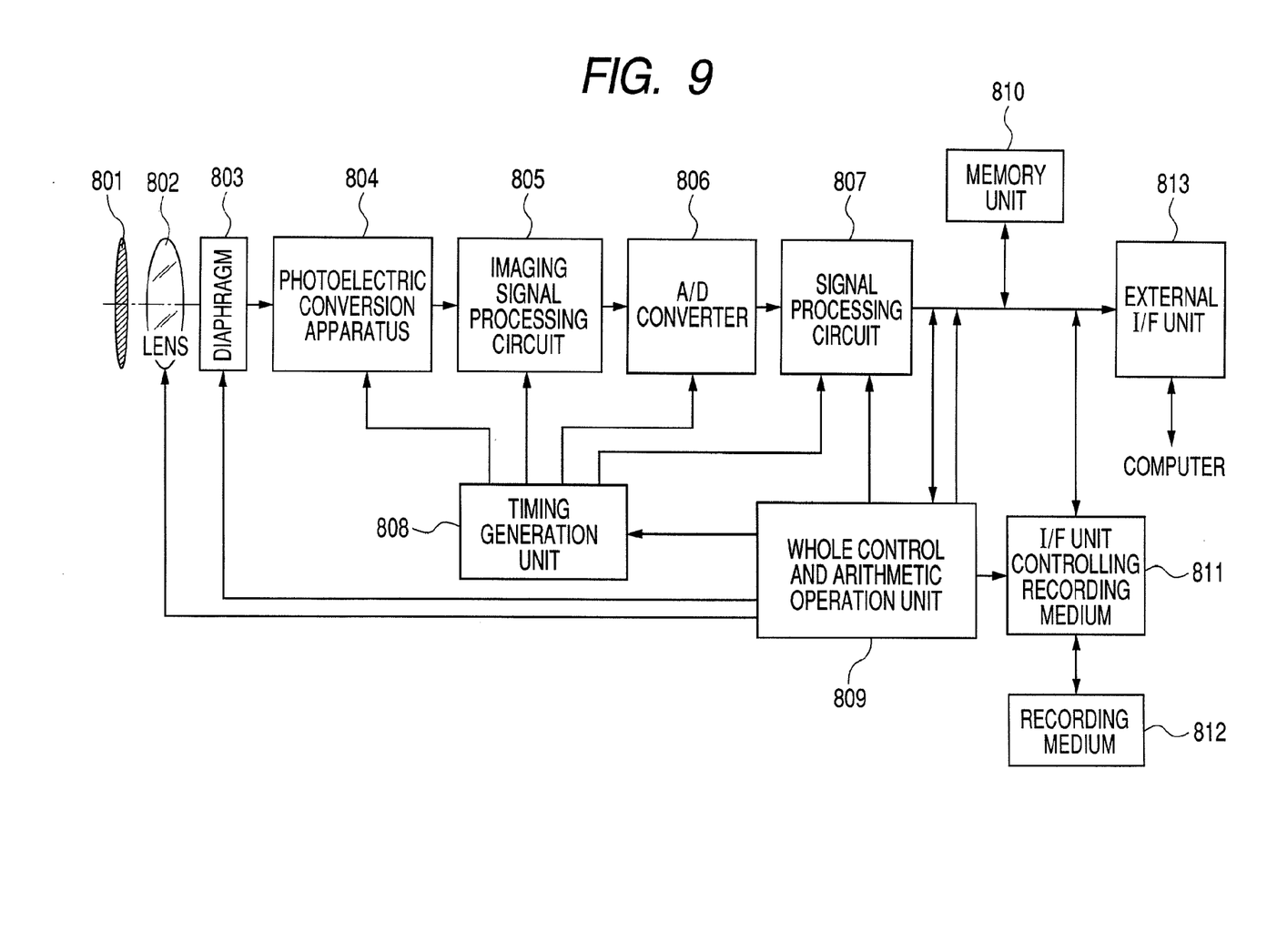
FIG. 9 is a block diagram illustrating an imaging system.

FIG. 9 is a configuration diagram of a digital still camera. The optical image of an object is formed on the imaging plane of a photoelectric conversion apparatus 804 with an optical system including a lens 802 and the like. On the outside of the lens 802, a barrier 801 combining the protection function of the lens 802 with the main switch can be provided. A diaphragm 803 for adjusting the quantity of the light outgoing from the lens 802 can be provided to the lens 802. Processing such as various corrections and clamping is performed to the imaging signals output from the photoelectric conversion apparatus 804 in a plurality of channels by an imaging signal processing circuit 805. The imaging signals output from the imaging signal processing circuit 805 in a plurality of channels are subjected to analogue to digital conversions in an A/D converter 806. The image data output from the A/D converter 806 is subjected to various corrections and data compression in a signal processing unit (image processing unit) 807. The photoelectric conversion apparatus 804, the imaging signal processing circuit 805, the A/D converter 806, and the signal processing unit 807 operate in conformity with timing signals generated by a timing generation unit 808. Each block is controlled by a whole control and arithmetic operation unit 809. In addition, the digital still camera includes a memory unit 810 for storing image data temporarily, and an interface unit controlling recording medium 811 for recording or reading out an image against a recording medium 812. The recording medium 812 is configured to include a semiconductor memory or the like, and can be attached to and detached from the digital still camera. Furthermore, the digital still camera may include an external interface (I/F) unit 813 for the communication with an external computer or the like. The imaging signal processing circuit 805, the A/D converter 806, the signal processing unit 807, and the timing generation unit 808 may be formed on the same chip as that of the photoelectric conversion apparatus 804 here.

Next, the operation of the digital still camera illustrated in FIG. 9 is described. In response of the opening of the barrier 801, the main power source, the power source of a control system, and the power source of the imaging system circuit, such as the A/D converter 806, are turned on in order. After that, in order to control an exposure amount, the whole control and arithmetic operation unit 809 opens the diaphragm 803. A signal output from the photoelectric conversion apparatus 804 passes through the imaging signal processing circuit 805 to be supplied to the A/D converter 806. The A/D converter 806 performs the A/D conversion of the signal to output the converted digital data to the signal processing unit 807. The signal processing unit 807 processes the input data to supply the processed data to the whole control and arithmetic operation unit 809, and the whole control and arithmetic operation unit 809 performs an operation for determining an exposure amount. The whole control and arithmetic operation unit 809 controls the diaphragm 803 on the basis of the determined exposure amount.

Next, the whole control and arithmetic operation unit 809 takes out a high frequency component from the signal output from the photoelectric conversion apparatus 804 and processed by the signal processing unit 807, and operates a distance from the digital still camera to the object on the basis of the high frequency component. After that, the whole control and arithmetic operation unit 809 drives the lens 802 to determine whether the lens 802 is in focus or not. If the whole control and arithmetic operation unit 809 determines that the lens 802 is not in focus, the whole control and arithmetic operation unit 809 drives the lens 802 again, and operates the distance.

Then, after the identification of in-focus, the main exposure is started. After the end of the exposure, the image signal output from the photoelectric conversion apparatus 804 is subjected to the correction and the line in the imaging signal processing circuit 805, and is subjected to A/D conversion in the A/D converter 806 to be processed in the signal processing unit 807. The image data processed in the signal processing unit 807 is stored in the memory unit 810 by the whole control and arithmetic operation unit 809. After that, the image data stored in the memory unit 810 is recorded in the recording medium 812 through the I/F unit 811 controlling the recording medium 812 under the control of the whole control and arithmetic operation unit 809. Moreover, the image data is supplied to a computer or the like to be processed therein through the external I/F unit 813.

In such a way, the photoelectric conversion apparatus of the present invention is applied to an imaging system. By using the photoelectric conversion apparatus of the present invention, the noise to an image signal owing to a global shutter can be reduced. Consequently, an image having a higher image quality can be obtained. Moreover, the removal of the noise generated in a signal processing circuit and the like can be easily performed.

In the above, several embodiments of the present invention have been described. However, the present invention is not limited to each embodiment, but can be suitably changed. Moreover, the configuration of each embodiment can be suitably combined. For example, the present invention is not limited to the configuration illustrated in FIG. 1 which configuration is provided with a discharge portion discharging a charge in the horizontal direction to the semiconductor substrate, but may have the configuration of discharging a charge into the vertical direction of the semiconductor substrate.

Moreover, the configuration of the first gate electrode 204 is not limited to the configuration described in the present embodiment. For example, the first gate electrode 204 may control the electric potential between the first semiconductor region 301 and the second semiconductor region 202. Moreover, the first gate electrode 204 may not extend to the over part of the second semiconductor region 202. Moreover, the first gate electrode 204 may not extend to the over part of the second semiconductor region 202, but a gate electrode may be separately provided over the second semiconductor region 202. Alternatively, the n type sixth semiconductor region of an impurity concentration lower than that of the first semiconductor region 301 may be formed under the first gate electrode 204. Then, the first semiconductor region 301, the second semiconductor region 202, the gate electrode, and the fifth semiconductor region 304 may constitute a buried channel type transistor. Furthermore, the arrangement of the semiconductor regions is not limited to the described ones, but the semiconductor regions may be divided into a plurality of regions or may be formed to be one collective region. Moreover, the polarity of a charge, the polarities of the semiconductor regions, and the polarities of the transistors can be suitably changed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-101529, filed Apr. 9, 2008, which is hereby incorporated by reference herein in its entirety.

What is claimed is:

1. A photoelectric conversion apparatus comprising:
    a semiconductor substrate;
    a photoelectric conversion portion including a first semiconductor region of a first conductivity type arranged in the semiconductor substrate;
    a charge holding portion including a second semiconductor region of the first conductivity type arranged in the semiconductor substrate and configured to hold a charge generated by the photoelectric conversion portion;
    a third semiconductor region of the first conductivity type arranged in the semiconductor substrate;
    a first gate electrode arranged on a region between the second semiconductor region and the third semiconductor region and configured to transfer a charge of the second semiconductor region into the third semiconductor region; and
    an isolation portion including a first part, a second part and a third part of an insulator, wherein
    the first semiconductor region is arranged between the first part of the insulator and the second semiconductor region in a first cross section including a first direction along which the first semiconductor region and the second semiconductor region are arranged,
    the second semiconductor region is arranged between the second part and the third part of the insulator in a second cross section including a second direction intersecting the first direction, and
    a part of the second part and a part of the third part of the insulator are arranged at a same depth as a bottom end of the second semiconductor region and/or at a depth lower than the second semiconductor region.

2. The photoelectric conversion apparatus according to claim 1, wherein the isolation portion defines an active region, and
    the first, second and third semiconductor regions are arranged in the active region.

3. The photoelectric conversion apparatus according to claim 1, wherein the isolation portion is arranged so as to electrically isolate the second semiconductor region.

4. The photoelectric conversion apparatus according to claim 1, further comprising:
    a second photoelectric conversion portion; and
    a second charge holding portion configured to hold a charge generated by the second photoelectric conversion portion, wherein
    the second part is arranged between the second semiconductor region and the second charge holding portion.

5. The photoelectric conversion apparatus according to claim 1, further comprising a transistor, wherein
    the isolation portion includes a fourth part of the insulator, and
    the fourth part of the insulator is arranged between the second semiconductor region and the transistor.

6. The photoelectric conversion apparatus according to claim 1, further comprising a second gate electrode arranged on a region between the first semiconductor region and the second semiconductor region and configured to transfer a charge of the first semiconductor region into the second semiconductor region, wherein
    the second gate electrode extends over the second semiconductor region.

7. A photoelectric conversion apparatus comprising:
    a semiconductor substrate including an active region defined by an insulator portion;
    a photoelectric conversion portion including a first semiconductor region of a first conductivity type arranged in the active region;
    a charge holding portion including a second semiconductor region of the first conductivity type arranged in the active region and configured to hold a charge generated by the photoelectric conversion portion;
    a third semiconductor region of the first conductivity type arranged in the active region;
    a fourth semiconductor region of a second conductivity type arranged under the second semiconductor region; and
    a first gate electrode arranged on a region between the second semiconductor region and the third semiconductor region and configured to transfer a charge of the second semiconductor region into the third semiconductor region, wherein
    the insulator portion includes a first part, a second part and a third part,
    the first semiconductor region is arranged between the first part of the insulator portion and the second semiconductor region in a first cross section including a first direction along which the first semiconductor region and the second semiconductor region are arranged,
    the second semiconductor region is arranged between the second part and the third part of the insulator portion in a second cross section including a second direction intersecting the first direction, and
    a part of the second part and a part of the third part of the insulator portion are arranged at a same depth as the fourth semiconductor region.

8. The photoelectric conversion apparatus according to claim 7, further comprising a second photoelectric conversion portion; and
    a second charge holding portion configured to hold a charge generated by the second photoelectric conversion portion, wherein
    the second part is arranged between the second semiconductor region and the second charge holding portion.

9. The photoelectric conversion apparatus according to claim 7, further comprising a transistor, wherein
    the insulator portion includes a fourth part, and
    the fourth part of the insulator portion is arranged between the second semiconductor region and the transistor.

10. The photoelectric conversion apparatus according to claim 7, further comprising a second gate electrode arranged on a region between the first semiconductor region and the second semiconductor region and configured to transfer a charge of the first semiconductor region into the second semiconductor region, wherein the second gate electrode extends over the second semiconductor region.

11. A photoelectric conversion apparatus comprising:

a semiconductor substrate;

a photoelectric conversion portion including a first semiconductor region of a first conductivity type arranged in the semiconductor substrate;

a charge holding portion including a second semiconductor region of the first conductivity type arranged in the semiconductor substrate and configured to hold a charge generated by the photoelectric conversion portion;

a third semiconductor region of the first conductivity type arranged in the semiconductor substrate;

a first gate electrode arranged on a region between the second semiconductor region and the third semiconductor region and configured to transfer a charge of the second semiconductor region into the third semiconductor region;

a second gate electrode arranged on a region between the first semiconductor region and the second semiconductor region and configured to transfer a charge of the first semiconductor region into the second semiconductor region; and an isolation portion including an insulator, wherein a part of the isolation portion is arranged at a depth deeper than the second semiconductor region, and a part of the first semiconductor region is arranged at a depth deeper than the part of the isolation portion.

12. The photoelectric conversion apparatus according to claim 11, wherein the second gate electrode extends over the second semiconductor region.

* * * * *